US012800690B2

(12) United States Patent
Hoshino

(10) Patent No.: US 12,800,690 B2
(45) Date of Patent: Nov. 17, 2026

(54) MAGNETIC RESONANCE IMAGING APPARATUS AND METHOD OF CONTROLLING THE SAME

(71) Applicant: FUJIFILM Corporation, Tokyo (JP)

(72) Inventor: Yusuke Hoshino, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 212 days.

(21) Appl. No.: 18/951,062

(22) Filed: Nov. 18, 2024

(65) Prior Publication Data

US 2025/0244433 A1 Jul. 31, 2025

(30) Foreign Application Priority Data

Jan. 30, 2024 (JP) ................................ 2024-012043

(51) Int. Cl.
*G01R 33/56* (2006.01)
*G01R 33/483* (2006.01)
*G01R 33/54* (2006.01)
*G01R 33/567* (2006.01)

(52) U.S. Cl.
CPC ..... *G01R 33/5676* (2013.01); *G01R 33/4835* (2013.01); *G01R 33/543* (2013.01)

(58) Field of Classification Search
CPC ............ G01R 33/5676; G01R 33/4835; G01R 33/543; G01R 33/283; G01R 33/56509
See application file for complete search history.

(56) References Cited

U.S. PATENT DOCUMENTS

2007/0257671 A1* 11/2007 Nayak .............. G01R 33/56333 324/307
2013/0342204 A1 12/2013 Zhang et al.
(Continued)

FOREIGN PATENT DOCUMENTS

JP 2000-157507 A 6/2000
JP 2008-154887 A 7/2008
JP 2012-000389 A 1/2012
(Continued)

OTHER PUBLICATIONS

The extended European search report issued by the European Patent Office on Apr. 15, 2025, which corresponds to European Patent Application No. 24214417.8-1122 and is related to U.S. Appl. No. 18/951,062.

(Continued)

*Primary Examiner* — G.M. A Hyder
(74) *Attorney, Agent, or Firm* — Studebaker Brackett PLLC

(57) ABSTRACT

Provided is a technique of minimizing an influence of TR extension due to a navigator echo for body motion detection without reducing a time resolution of body motion detection in imaging using the navigator echo.
In a case in which imaging is performed in accordance with a predetermined pulse sequence by using an MRI apparatus, control of generating a navigator echo at a predetermined timing in the pulse sequence is performed, and control of making a timing at which the navigator echo is acquired different between a case in which a repetition time of the pulse sequence is equal to or greater than a preset threshold value and a case in which the repetition time is less than the threshold value is performed.

12 Claims, 11 Drawing Sheets

(56) References Cited

U.S. PATENT DOCUMENTS

| | | | | |
|---|---|---|---|---|
| 2016/0169999 A1* | 6/2016 | Herza | .................. | A61B 5/0036 600/411 |
| 2017/0160366 A1* | 6/2017 | Tisdale | ............ | G01R 33/56509 |

FOREIGN PATENT DOCUMENTS

| | | |
|---|---|---|
| JP | 2022-022669 A | 2/2022 |
| JP | 2023-043001 A | 3/2023 |

OTHER PUBLICATIONS

Vaculciaková Lenka et al., "Combining navigator and optical prospective motion correction for high-quality 500 μm resolution quantitative multi-parameter mapping at 7T", Magnetic Resonance in Medicine, vol. 88, No. 2, Apr. 11, 2022, pp. 787-801.

* cited by examiner

TR
401
402
403
Navi1
Navi2
411
412
413
RF
Navi
S1
S2
S3

TR
401
402
403
Navi1
Navi1
411
412
413
RF
Navi
S1
S2
S3

MAGNETIC RESONANCE IMAGING APPARATUS AND METHOD OF CONTROLLING THE SAME

CROSS-REFERENCE TO RELATED APPLICATIONS

The present application claims priority under 35 U.S.C. § 119 to Japanese Patent Application No. 2024-012043, filed Jan. 30, 2024. Each of the above application(s) is hereby expressly incorporated by reference, in its entirety, into the present application.

BACKGROUND OF THE INVENTION

1. Field of the Invention

The present invention relates to a magnetic resonance imaging apparatus (hereinafter, referred to as an MRI apparatus), and particularly relates to control of an MRI apparatus that performs imaging by generating a navigator echo for detecting a body motion in order to suppress an influence of the body motion.

2. Description of the Related Art

In an examination using the MRI apparatus, an examination target is disposed in a static magnetic field space, nuclear magnetic resonance is induced within the examination target, nuclear magnetic resonance signals are collected, and an image of the examination target is reconstructed by performing an operation on the nuclear magnetic resonance signals. The MRI examination target is usually a human being (hereinafter, referred to as a subject) such as a patient, and a sudden motion (referred to as a body motion, which is distinguished from a periodic motion such as breathing) such as a sneezing or coughing may occur in addition to a motion such as a respiratory motion during the examination. Since the nuclear magnetic resonance signals are signals that has been given positional information by applying a gradient magnetic field, in a case in which such a body motion occurs, the gradient magnetic field is applied to a position different from the original gradient magnetic field, and the image reconstruction itself may be difficult, for example, an artifact may occur in the image reconstructed from the nuclear magnetic resonance signals.

In the MRI apparatus, various measures are taken against an influence of such a body motion. For example, in the technique disclosed in JP2023-043001A, the body motion of the examination target is detected from a camera video, and a pulse sequence is divided and executed depending on whether or not the body motion is within an allowable range.

In addition, a method of surveilling the motion of the subject using a signal (called a navigator echo) obtained by MRI is also widely used (JP2012-000389A, JP2008-154887A). In imaging using navigator data, the navigator echo is generated separately from a nuclear magnetic resonance signal (hereinafter, referred to as an image signal) for obtaining an image of the subject, and the motion of the subject is estimated from a change in data (hereinafter, referred to as navigator data) consisting of a series of navigator echoes obtained in time series, and correction of the image signal or a reconstructed image is performed using a result of the estimation.

In a case in which the body motion is detected from the navigator echo or the camera video, control is also performed, such as re-acquiring an image signal acquired in a case in which a large body motion is detected or adopting an image reconstruction method that does not use the image signal (for example, JP2022-022669A).

SUMMARY OF THE INVENTION

Since the navigator echo is acquired separately from the image signal, adding a step for acquiring the navigator echo lengthens the pulse sequence itself for acquiring the image signal. That is, the image signal is collected by repeating application of an excitation RF pulse and acquisition of a nuclear magnetic resonance signal while changing a strength of a phase-encoding gradient magnetic field, but a repetition time (TR) between one excitation RF pulse and the next excitation RF pulse is extended. As a result, an imaging time is prolonged, which increases a burden on an operator or a subject whose motion is restricted in a closed space.

On the other hand, the repetition time of the pulse sequence varies depending on the pulse sequence and also varies depending on a type of a contrast image to be obtained in the MRI examination. For example, the TR is long in T2-weighted imaging (T2WI), and the TR is short in T1-weighted imaging (T1WI). In the long TR imaging, even in a case in which the navigator echo is acquired for each TR, the influence is small, but, in the short TR imaging, in a case in which the navigator echo is acquired for each TR, the influence is large, and the disadvantage due to the TR extension is also large.

JP2023-043001A discloses that a navigator echo is acquired for each phase in accordance with a phase of a respiratory motion, but it is not possible to respond a body motion which is a sudden motion with such timing control. In addition, JP2012-000389A discloses that a navigator pulse sequence is executed for each slice in a case of imaging a plurality of slices, but does not take TR into consideration, and in the short TR imaging, a problem in that the TR is extended by executing the navigator pulse sequence cannot be solved.

It is also considered to reduce a frequency of navigator echo acquisition in order to prevent the TR extension due to the navigator data collection, but this leads to a decrease in time resolution of the body motion detection, making it difficult to respond an instantaneous or sudden body motion.

The present invention has been made to solve the problem of MRI using the navigator data as described above, and an object of the present invention is to provide an MRI apparatus and a method of controlling the same that minimize an influence of TR extension due to a navigator echo without reducing a time resolution of body motion detection.

In order to solve the above problem, an MRI apparatus according to an aspect of the present invention automatically controls a timing of acquiring a navigator echo according to a TR of a set pulse sequence such that a frequency of acquiring the navigator echo is kept in a predetermined range.

That is, the MRI apparatus according to the aspect of the present invention comprises: an RF transmitting unit that applies a high-frequency magnetic field pulse to an examination target placed in a static magnetic field space; an RF receiving unit that receives a nuclear magnetic resonance signal emitted by the examination target; a gradient magnetic field generation unit that generates a gradient magnetic field pulse for applying a magnetic field gradient to a static magnetic field; an image generation unit that generates an image of the examination target by using the nuclear magnetic resonance signal; and a controller that controls the RF transmitting unit, the RF receiving unit, and the gradient magnetic field generation unit in accordance with a predetermined pulse sequence, in which the predetermined pulse sequence includes a pulse sequence for generating a navigator echo separately from an echo signal for image generation of the examination target. The controller performs control of making a timing of generating the navigator echo different between a case in which a repetition time of the pulse sequence is equal to or greater than a preset threshold value and a case in which the repetition time is less than the threshold value.

The timing of generating the navigator echo is preferably controlled to be equal to or greater than a predetermined frequency, regardless of the TR.

A method of controlling an MRI apparatus according to another aspect of the present invention comprises: in a case in which imaging is performed in accordance with a pulse sequence, performing control of generating a navigator echo at a predetermined timing in the pulse sequence, and performing control of making a timing at which the navigator echo is acquired different between a case in which a repetition time of the pulse sequence is equal to or greater than a preset threshold value and a case in which the repetition time is less than the threshold value.

According to the present invention, it is possible to suppress TR extension without reducing a time resolution of navigator echo acquisition by controlling a navigator echo acquisition timing according to a length of the TR, such as acquiring the navigator echo for each of a plurality of slices measured in one TR, that is, for each slice, in imaging in which the TR is long and acquiring the navigator echo within one TR in a smaller number of times than the number of the slices, rather than every slice, in imaging in which the TR is short. In addition, by controlling the acquisition timing of the navigator echo using a threshold value, it is possible to save time and effort of user setting and to perform automatic control.

DESCRIPTION OF THE PREFERRED EMBODIMENTS

Hereinafter, an embodiment of an MRI apparatus according to an embodiment of the present invention will be described.

There are various types of MRI apparatuses, such as a horizontal magnetic field type and a vertical magnetic field type, depending on a direction of a generated static magnetic field, and a permanent magnet type, a normal electromagnetic type, and a superconducting magnet type, depending on a magnet that generates the static magnetic field. The present invention can be applied to a known MRI apparatus. In addition, a shape of a static magnetic field space in which a subject is placed is a cylindrical space, a planar space sandwiched between upper and lower magnets, or the like, and the present invention can be applied to any of these shapes.

First, an outline of the MRI apparatus to which the present invention is applied will be described with reference to FIG. 1.

Figure 1:
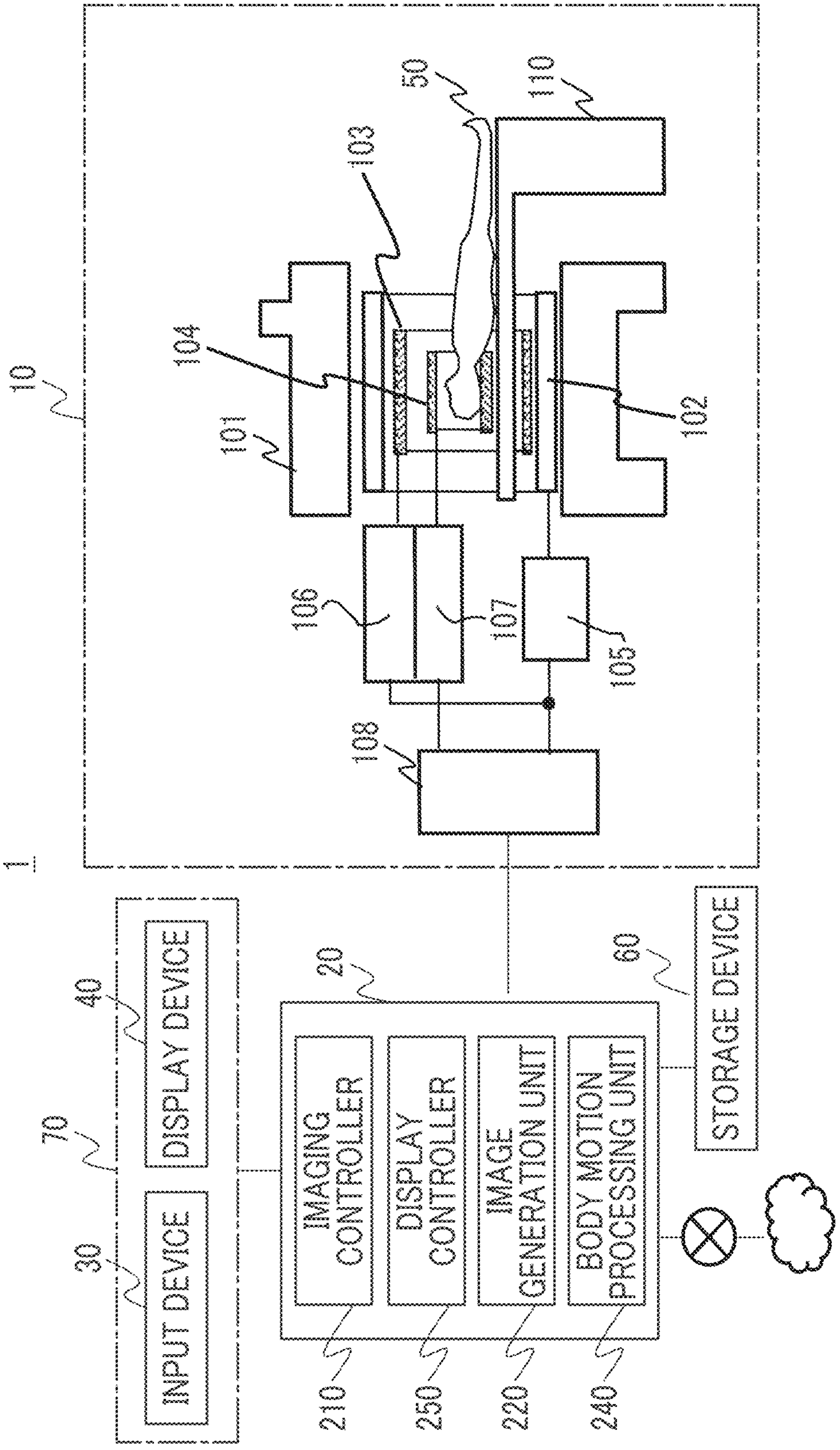
FIG. 1 is an overall view showing an outline of an MRI apparatus.

As shown in FIG. 1, an MRI apparatus 1 comprises a static magnetic field generation device (static magnetic field generating magnet) 101 that generates a static magnetic field, an RF transmitting unit 106 that applies a high-frequency magnetic field pulse to an examination target 50 placed in a space in which a static magnetic field is generated by a static magnetic field magnet, an RF receiving unit 107 that receives a nuclear magnetic resonance signal emitted by the examination target 50, a gradient magnetic field coil 102 and a gradient magnetic field power supply 105 (collectively referred to as a gradient magnetic field generation unit) that generate an gradient magnetic field pulse for applying a magnetic field gradient to the static magnetic field, a sequencer 108 that controls the gradient magnetic field power supply 105, the RF transmitting unit 106, and the RF receiving unit 107 in accordance with a predetermined pulse sequence, and a controller 20 that controls the entire apparatus including the sequencer 108. An RF transmission coil 103 for applying the RF pulse generated by the RF transmitting unit 106 to the subject and an RF receive coil 104 for detecting the nuclear magnetic resonance signal generated by the examination target 50 are disposed close to the examination target 50. Hereinafter, the RF transmitting unit 106, the RF receiving unit 107, and the gradient magnetic field generation unit are also collectively referred to as an imaging unit 10.

The controller 20 can be configured as a general-purpose computer comprising a memory and a CPU and functions as a controller and an operation unit, and includes an imaging controller 210 that controls an operation of the imaging unit 10, an image generation unit 220 that generates an image of the examination target 50 using the nuclear magnetic resonance signal received by the RF receiving unit 107, a display controller 250 that displays the image generated by the image generation unit 220, and the like. In addition, as will be described in below later, the controller 20 comprises a body motion processing unit 240 that detects a body motion of the examination target during the examination and that performs various types of operations and control using detected body motion information. The functions of the controller 20 are implemented by the CPU uploading a predetermined program. In addition, a part of the functions can also be implemented by a programmable IC.

An input device 30 through which an operator inputs a command, data, and the like necessary for imaging, a display device 40 that displays the image generated by the image generation unit 220, a storage device 60, and the like are connected to the controller 20. The storage device 60 includes an internal storage device and an external storage device, and the external storage device may be a storage device such as a cloud connected through the Internet or the like. In addition, the MRI apparatus 1 can also exchange data with an external database (not shown) such as PACS. The input device 30 and the display device 40 are installed close to each other and function as a user interface unit 70.

In addition, the MRI apparatus 1 may comprise a surveillance camera (not shown) for surveilling a state of the examination target 50 disposed in the static magnetic field space, and it is also possible to detect the body motion of the examination target 50 using a video from the surveillance camera. In this case, the body motion processing unit 240 receives information from the surveillance camera, and performs processing using the information together with measurement data (navigator data) from the imaging unit 10 described below as body motion information.

Since a configuration of the imaging unit 10 is the same as that of an imaging unit in the related art, description of a specific configuration will be omitted, and an outline of an operation will be described.

First, the RF pulse generated by the RF transmitting unit 106 is applied to the examination target 50 via the RF transmission coil 103, and thus nuclei (usually protons) of atoms contained in the tissue constituting the examination target 50 are excited. The RF receive coil 104 disposed close to the examination target 50 detects a nuclear magnetic resonance signal generated by nuclear magnetic resonance of the excited atomic nuclei, and the RF receiving unit 107 receives the nuclear magnetic resonance signal as a digital signal. In addition, during a period from the excitation by the RF pulse to the collection of the nuclear magnetic resonance signal, the gradient magnetic field generation unit applies a predetermined gradient magnetic field to the static magnetic field at a predetermined timing. As a result, the nuclear magnetic resonance signal is a signal having positional information, that is, an encoded signal. In addition, by applying the gradient magnetic field pulse simultaneously with the excitation, it is possible to select a specific region (slice) of the examination target and generate the nuclear magnetic resonance signal only from the selected slice.

Figure 2:
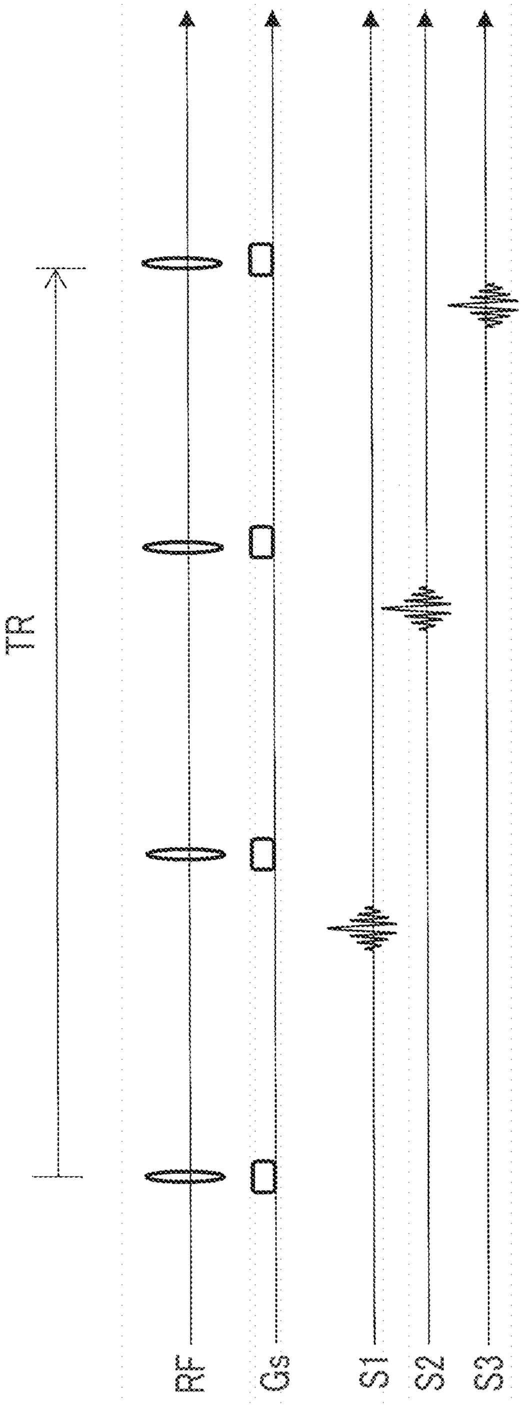
FIG. 2 is a diagram illustrating multi-slice imaging.

Since a region having a predetermined thickness is generally imaged, for example, an image signal for each slice is collected while repeating the excitation and the collection of the nuclear magnetic resonance signal for each of a plurality of slices at a predetermined TR. In a case of imaging a plurality of slices, as shown in FIG. 2, multi-slice imaging is generally performed in which selective excitation (application of a gradient magnetic field pulse Gs and an RF pulse) and signal collection of second and third slices S2 and S3 are sequentially performed while shifting the time before a repetition time TR of one slice S1 is reached. In FIG. 2, only a slice selection gradient magnetic field Gs is shown for the gradient magnetic field, and phase-encoding and readout gradient magnetic field pulses are omitted.

The series of operations of the imaging unit 10 are controlled based on a pulse sequence that is a time chart in which the intensity and application timing of the RF pulse and the gradient magnetic field pulse, the signal collection time, and the like are determined. Various pulse sequences that differ depending on an imaging purpose or an imaging method are stored in advance in the storage device 60 of the MRI apparatus, and the sequencer 108 calculates a pulse sequence (referred to as an imaging sequence) to be used for imaging by using the pulse sequence selected depending on the imaging purpose or the imaging method and imaging parameters (repetition time TR, echo time TE, FOV, slice thickness, the number of slices, speed rate, and the like) set by the user, and imaging is performed in accordance with the imaging sequence.

The image generation unit 220 reconstructs and generates an image by performing an operation such as Fourier transformation or an iterative operation using the nuclear magnetic resonance signal (image data) collected and digitized by the RF receiving unit 107, and performs image processing or the like on the generated image. The image generated by the image generation unit 220 is displayed on the display device 40. Alternatively, the image may be stored in the storage device 60 or transmitted to an external database such as PACS.

The MRI apparatus according to the embodiment of the present invention executes a pulse sequence accompanied by the collection of navigator data as the above-described pulse sequence, and is characterized in that the timing of the collection of the navigator data is automatically controlled by using the repetition time TR of the pulse sequence set as the imaging parameter.

In consideration of the configuration of the MRI apparatus, an embodiment of control in the multi-slice imaging will be described below.

Embodiment 1

In the present embodiment, an acquisition timing of the navigator data is controlled according to the TR of the set imaging sequence. In order to perform the control according to the TR, in the present embodiment, a threshold value TH is set in advance for the TR of the pulse sequence, and the acquisition of the navigator data is controlled according to whether the TR is equal to or greater than or less than the threshold value TH.

Figure 3:
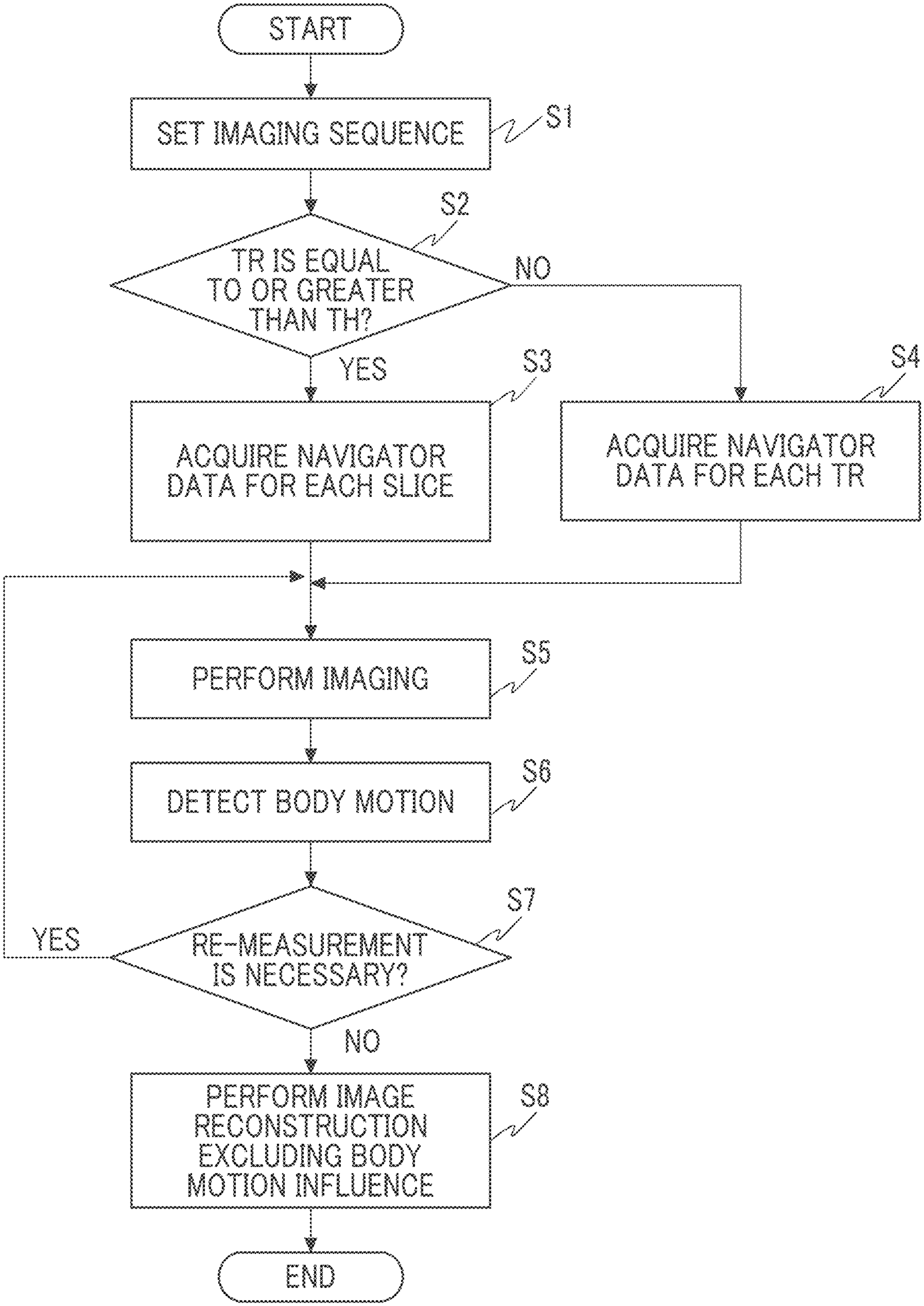
FIG. 3 is a diagram showing a flow of imaging control of a controller.

FIG. 3 shows a flow of control of the imaging controller 210 of the present embodiment. As shown in FIG. 3, in a case in which the imaging sequence is set (S1), the imaging controller 210 compares the repetition time TR of the set imaging sequence with a preset threshold value TH (S2), acquires a navigator echo for each slice in a case in which the repetition time TR is equal to or greater than the threshold value (S3), and sets an acquisition timing of the navigator echo such that the navigator echo is acquired for each TR in a case in which the repetition time TR is less than the threshold value (S4). In this case, the number of times the navigator echo is acquired may be adjusted such that an acquisition frequency of the navigator echo does not fall below a predetermined frequency.

After that, imaging is started (S5), and the navigator data is collected and image signals are collected. The body motion processing unit 240 uses the sequentially acquired navigator data to determine whether or not the body motion is occurring, and, in a case in which the body motion is occurring, the body motion processing unit 240 specifies an image signal (position in k-space data) collected at a time point at which the body motion has occurred (S6). In a case in which the time point at which the body motion has occurred and the position of the data in the k-space collected at the time point are specified, the information is sent to the image generation unit 220 or the imaging controller 210.

The image generation unit 220 performs image reconstruction by performing an image reconstruction operation, such as an iterative operation, using the remaining k-space data after excluding the specified data in the k-space (S8). In addition, in a case in which it is difficult to perform image reconstruction even though the data is excluded, such as a case in which a time during which the body motion occurs is long (S7), the imaging controller 210 controls the imaging unit 10 to reacquire the excluded data in the k-space.

Hereinafter, specific contents of each of the above-described steps will be described.

Imaging Sequence Setting (S1 and S2)

As described above, the imaging sequence is determined by the pulse sequence type selected according to the imaging purpose and the imaging parameter set by the user. The pulse sequence type can be roughly divided into a spin echo (SE) system sequence and a gradient echo (GrE) system sequence, and various pulse sequences are known, such as a high-speed imaging sequence (FSE, RSSG) developed from these sequences, a gradient magnetic field (MPG) pulse for diffusion enhancement, a sequence in which a pre-pulse such as a fat suppression pulse is added, and the present invention is not limited to these pulse sequences.

Main imaging parameters include an echo time TE, a repetition time TR, a FOV, a slice thickness, the number of slices, and a speed rate R (corresponding to a rate at which k-space data is thinned out), and the imaging parameters can be set in advance as an examination flow or can be set by the user according to the imaging purpose or the examination target. In any pulse sequence, the TE and the TR are important imaging parameters that contribute to the contrast of the image. For example, the TR is about 450 ms in T1-weighted imaging (T1WI) of the SE system, and the TR is 3800 ms in T2-weighted imaging (T2W1).

In a case in which the imaging parameters are set, the imaging controller 210 compares the set TR with the threshold value TH. The TH may be, for example, one numerical value between the longest TR and the shortest TR (700 to 1000 ms) in general, or may be a lower limit value of the TR of imaging generally regarded as long TR imaging or an upper limit value of the TR of imaging generally regarded as short TR imaging. In addition, for the TH, instead of a single value, two or more THs (TH1, TH2, and the like) can be set. The TH is stored in the storage device 60 of the MRI apparatus, and is read out and used in a case of the determination in step S2. In addition, it is also possible to allow the user to set the value as appropriate.

Long TR Imaging (S3 and S5)

In a case in which the TR set in S1 is equal to or greater than the TH, the navigator echo is acquired for each slice (S3), and the imaging is started (S5).

Figure 4A:
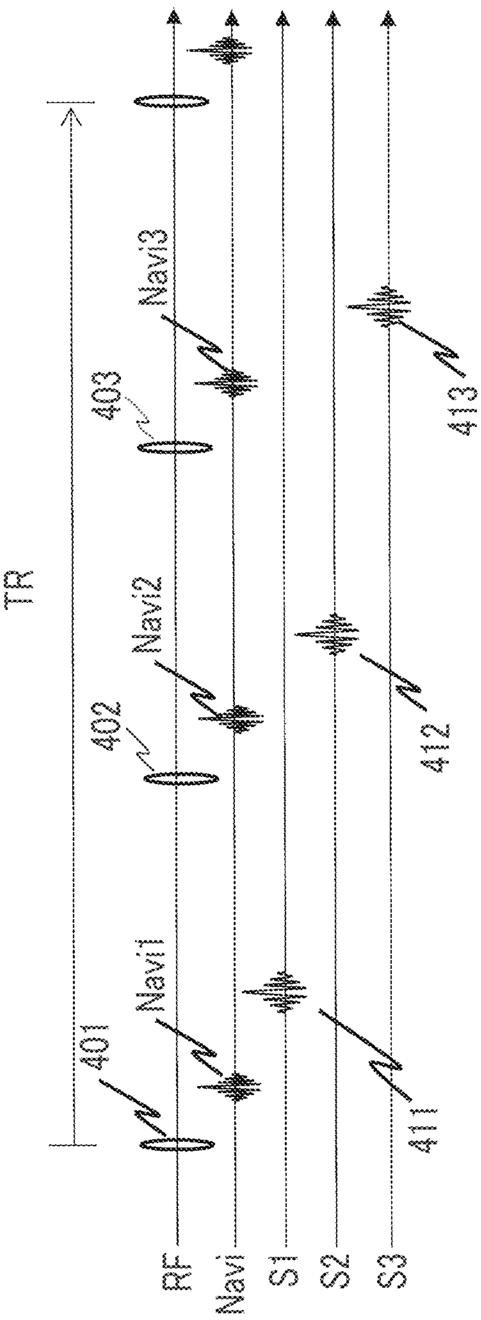
FIGS. 4A and 4B are diagrams showing an example of a pulse sequence including navigator data collection (a case of a long TR), and show examples with different timings of acquisition of a navigator echo.
Figure 4B:
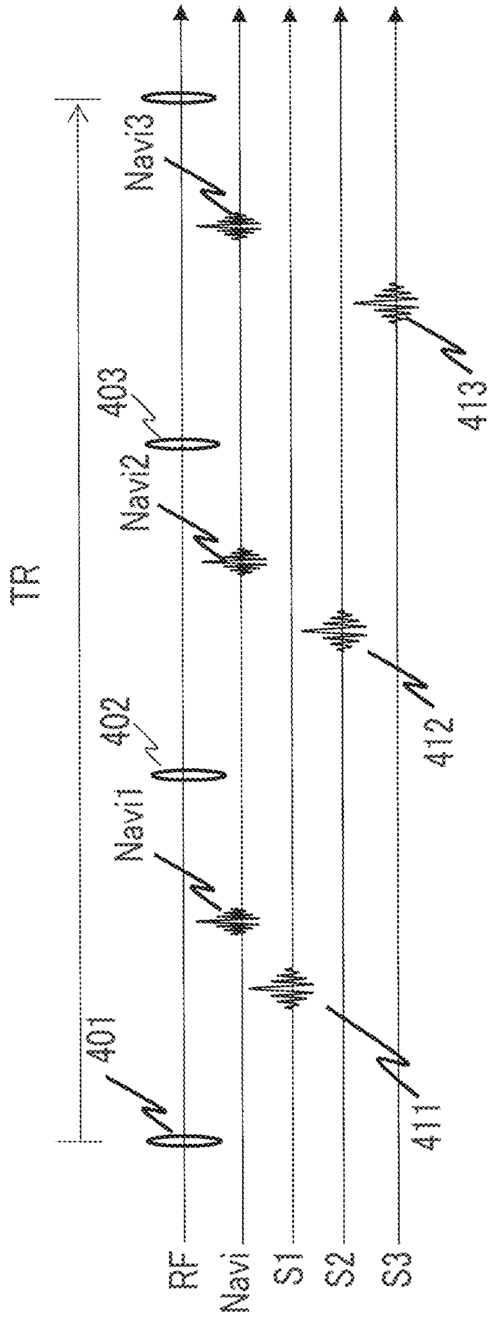

A pulse sequence including the acquisition of the navigator echo is known, and an example of a case of multi-slice imaging is shown in FIGS. 4A and 4B. In the method shown in FIG. 4A, navigator echoes Navi1, Navi2, and Navi3 are acquired each time image signals 411, 412, and 413 of slices S1, S2, and S3 are acquired. The navigator echo may be a free induction decay (FID) signal to which no readout gradient magnetic field is applied or an echo signal to which the readout gradient magnetic field is applied, but an example in which the navigator echo is acquired as the FID is shown here. In any case, the data is collected without applying the phase encoding.

In addition, FIG. 4A shows a case in which the navigator echoes Navi1, Navi2, and Navi3 are acquired before the image signals 411, 412, and 413 are collected, but as shown in FIG. 4B, the navigator echoes may be collected after the image signals are collected. In the case of acquiring the navigator echo as the FID, it is desirable to collect the data after the image signal since the TE is extended by acquiring the navigator echo.

Figure 5A:
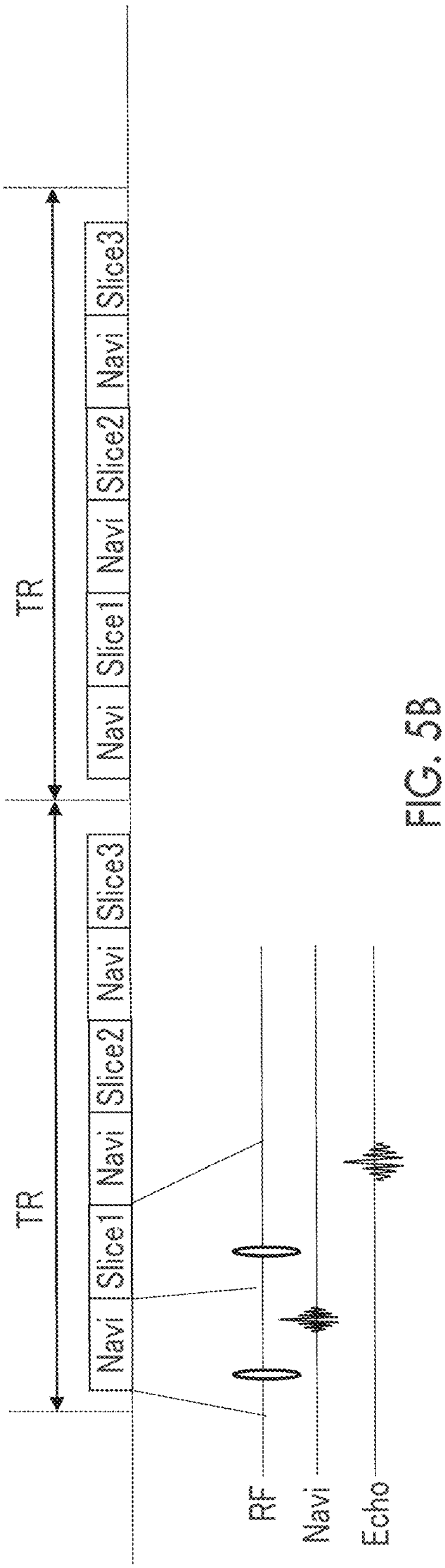
FIGS. 5A and 5B are diagrams showing examples with different navigator data acquisition timings in a case of long TR imaging including a navigator echo generation sequence.
Figure 5B:
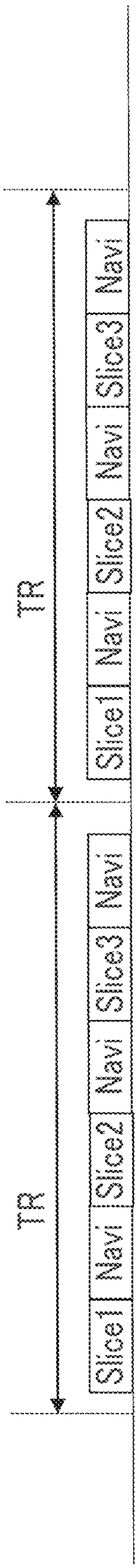

Further, in FIGS. 4A and 4B, the navigator echo is acquired after RF pulses 401 to 403 for slice excitation (including a combination of two or more RF pulses) are applied, but as shown in FIGS. 5A and 5B, it is also possible to acquire the navigator echo by executing a sequence for generating the navigator echo separately from the RF pulse for acquiring the image signal. In this case, the RF pulse used in the navigator echo generation sequence may be any of an RF pulse for slice selection that is the same as a slice of an imaging target or an RF pulse that excites the entire imaging region of the examination target.

After the timing of collecting the navigator data is decided as described above, the imaging is started (S5).

Short TR Imaging (S4 and S5)

Figure 6A:
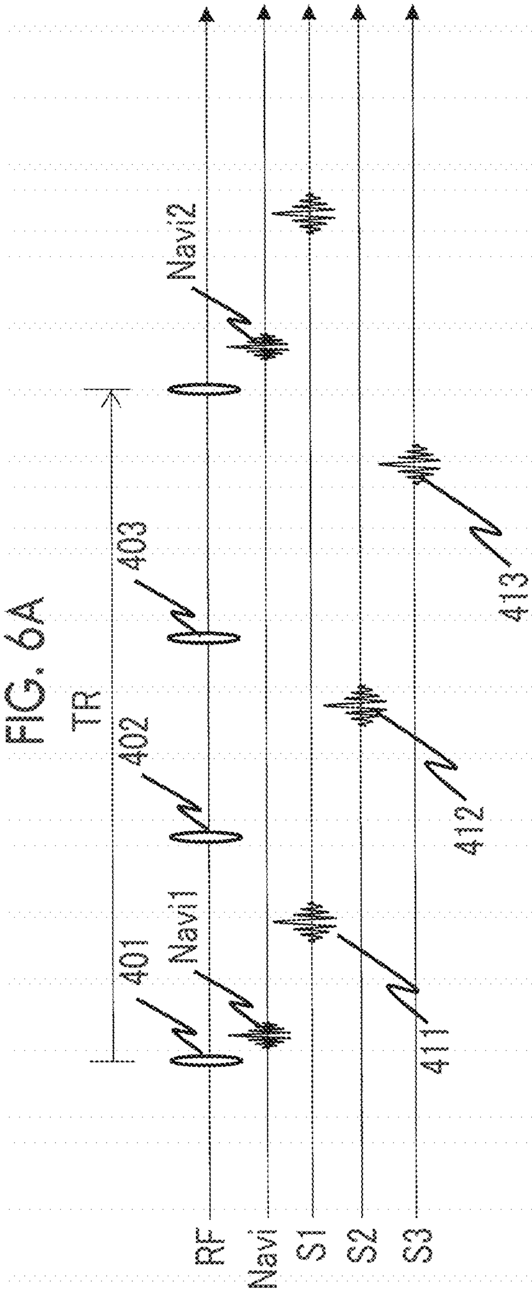
FIGS. 6A and 6B are diagrams showing an example of a pulse sequence including navigator data collection, and show a case of a short TR.
Figure 6B:
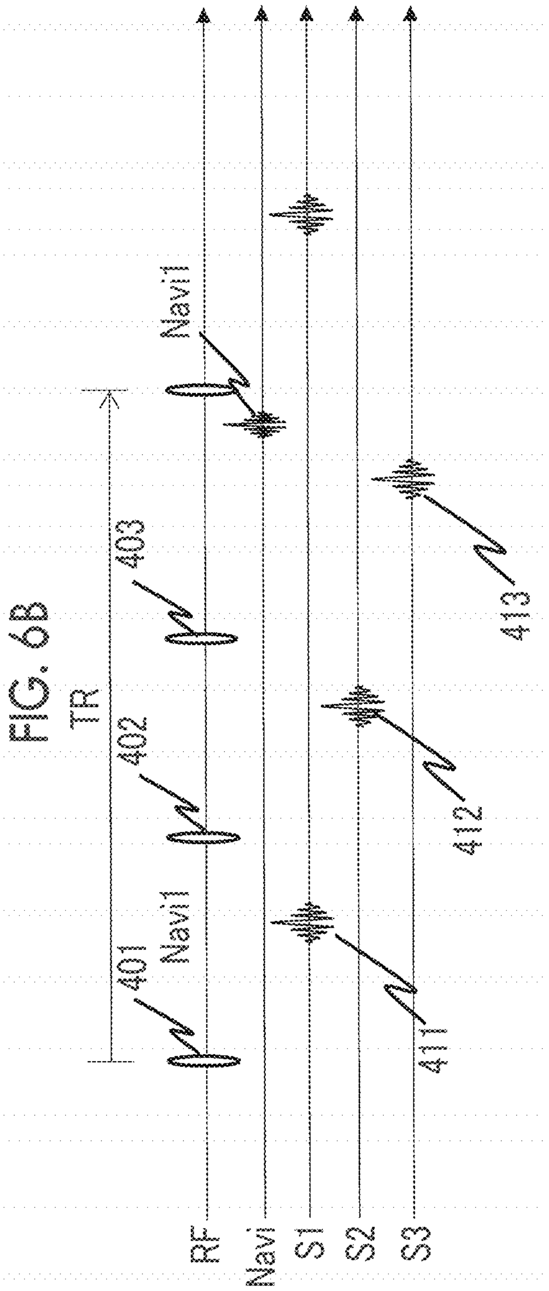
Figure 7A:
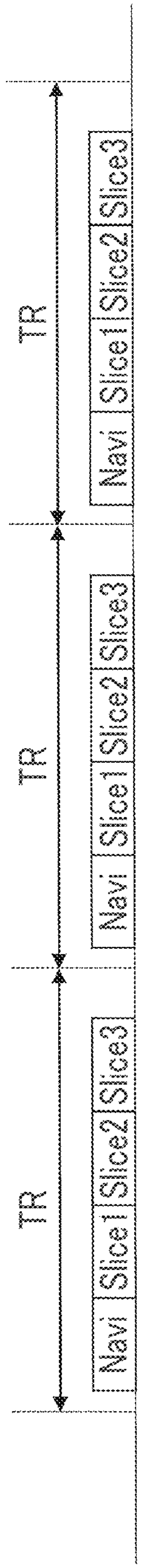
FIGS. 7A and 7B are diagrams showing examples with different navigator data acquisition timings in a case of short TR imaging including a navigator echo generation sequence.
Figure 7B:
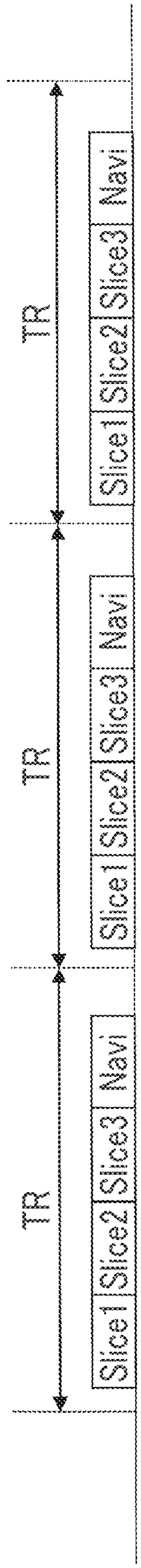

On the other hand, in a case in which the repetition time TR of the set imaging sequence is less than the threshold value, the number of times the navigator echo is acquired is reduced. Specifically, as shown in FIGS. 6A and 6B and FIGS. 7A and 7B, the navigator echo is acquired for each TR (S4). FIGS. 6A and 6B show a case in which the navigator echo is acquired as the FID, and FIGS. 7A and 7B show a case in which the navigator echo is acquired by executing a sequence that generates the navigator echo separately from the RF pulse for slice excitation, instead of the FID. In any case, the navigator echo may be acquired before or after the image signal collection, and the effect of shortening the TR can be obtained. After the timing of collecting the navigator data is decided in this manner, the imaging is started (S5).

In a case in which the TR is long as described above, the navigator echo is acquired for each slice, and in a case in which the TR is short, the navigator echo is acquired for each TR. In imaging such as T2WI or proton density imaging (PDWI) in which the TR is set to be long, since the TR is originally long, the influence on the TR is small even though the navigator echo is acquired for each slice, and the body motion information at that time can be obtained for each slice. In addition, in imaging in which it is necessary to set the TR to be short, for example, T1-weighted imaging or T2* imaging, the extension of the TR can be suppressed by acquiring the navigator echo for each TR, and since the TR is short, the acquisition frequency of the navigator data, that is, the time resolution of the body motion detection can be maintained to be the same as that in imaging in which the TR is long.

Body Motion Processing: S6 and S7

The method of the body motion processing using the body motion processing unit 240 is the same as the method disclosed in, for example, JP2022-022669A, but an example of the method will be described below.

Figure 8:
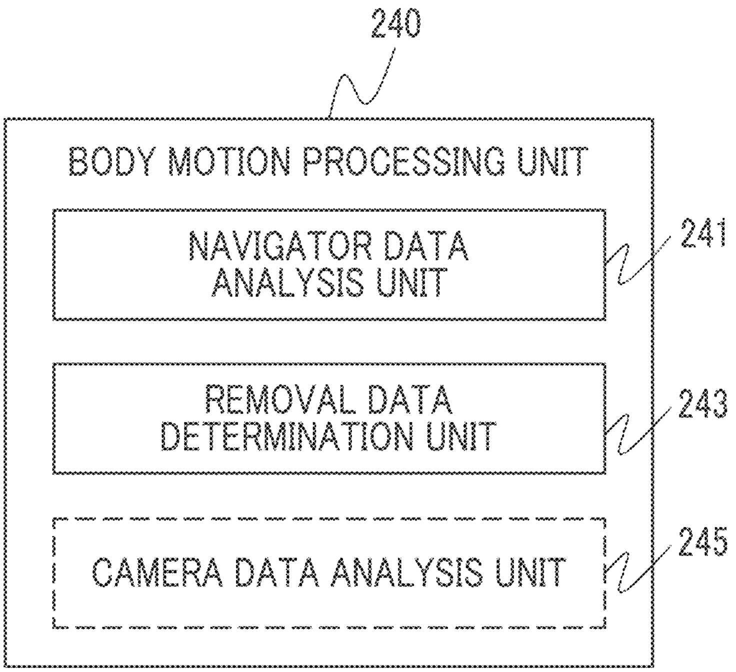
FIG. 8 is a functional block diagram of a body motion processing unit.

FIG. 8 is a functional block diagram of the body motion processing unit 240. As shown in FIG. 8, the body motion processing unit 240 comprises a navigator data analysis unit 241 and a removal data determination unit 243. In addition, in a case in which a camera for surveilling a body motion is installed in the MRI apparatus 1, a camera data analysis unit 245 that captures a video from the camera may be included.

Figure 9:
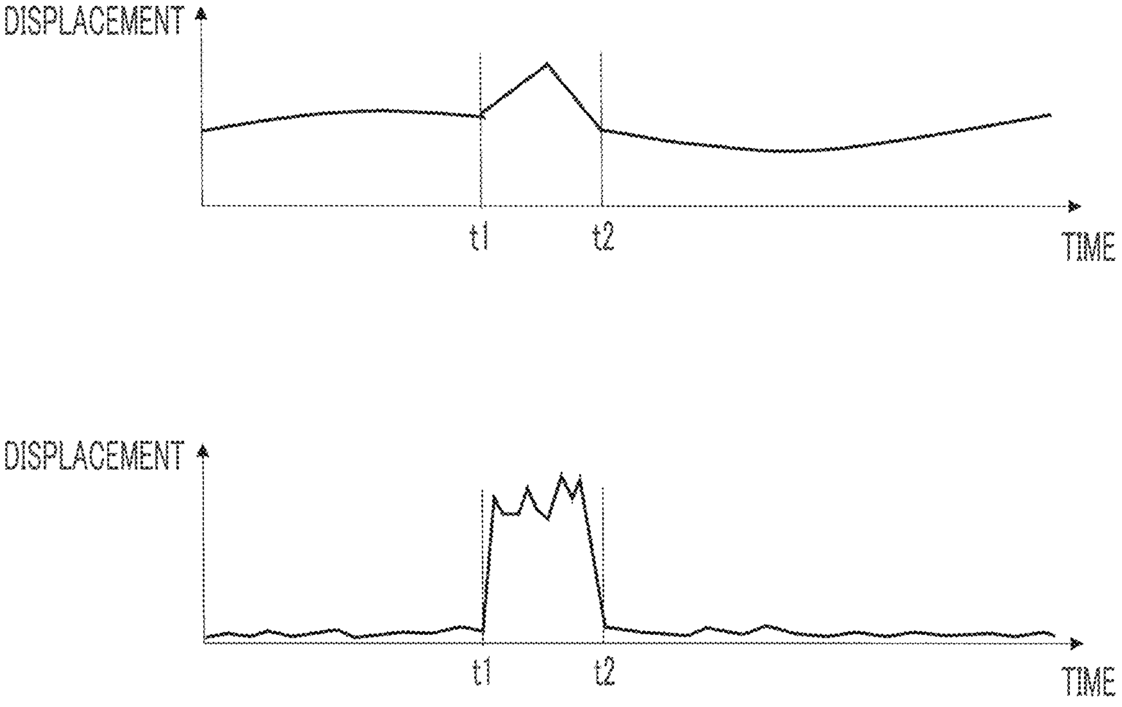
FIG. 9 is a diagram showing an example of body motion data obtained from navigator data.

The navigator data analysis unit 241 analyzes the navigator data collected by the imaging unit 10 and detects that the body motion has occurred from fluctuations in the navigator data. As schematically shown in FIG. 9, in a case in which there is no motion in the examination target, the navigator echo that is not subjected to phase encoding is a signal from the entire excited region, and a signal intensity is stable. In a part where there is a periodic motion such as a respiratory motion, the signal intensity periodically fluctuates on an upper side of FIG. 9. Meanwhile, in a case in which a motion occurs in the measurement region due to the body motion, the signal intensity fluctuates greatly. The navigator data analysis unit 241 can detect the body motion by analyzing the characteristics of the fluctuation such as the magnitude and frequency of the fluctuation of the signal intensity.

As an example of the analysis method, a reference signal obtained by averaging a plurality of navigator echoes is determined, and a root mean square (RMS) is calculated by subtracting the reference signal from each navigator echo. A navigator echo having a large error (RMS) from the reference signal is specified, a navigator echo in which an error is detected is specified, and image data obtained between the navigator echoes in which the error is detected (between t1 and t2) is regarded as body motion-related data.

According to this method, it is possible to easily determine the body motion using the navigator echo, and it is possible to improve the real-time performance of the body motion detection. However, the body motion detection method of the present embodiment is not limited to this method, and it is also possible to adopt an operation using a phase difference between the navigator echo and the reference navigator echo.

As described above, in a case in which the navigator data analysis unit 241 determines that the body motion has occurred, the navigator data analysis unit 241 specifies the occurrence time (FIG. 9: t1, t2) of the body motion and specifies a range of data (data to be removed: referred to as removal data) collected in a case in which the body motion has occurred in the image data (k-space data) collected by the imaging unit 10.

The body motion processing unit 240 decides whether to use measurement data after removing the removal data specified by the navigator data analysis unit 241 for image reconstruction or to perform re-measurement (S7), and passes the confirmed measurement data to the image generation unit 220 according to a decision result. Alternatively, the body motion processing unit 240 decides the re-measurement range and sends the information to the imaging controller 210.

Image Reconstruction: S8

In a case in which there is no body motion during the collection of the image signal, the image generation unit 220 performs image reconstruction using normal fast Fourier transformation FT, a parallel imaging PI operation according to a speed rate, iterative reconstruction, and the like. In a case in which the body motion occurs, the image reconstruction is performed using k-space data from which the specified removal data has been removed. In an image reconstruction method of k-space data having a smaller number of data than the original number of data, in a case in which the number of data to be removed is small, the image reconstruction may be performed by fast Fourier transformation after performing a method of replacing the removed data with zero, correction using Hermitian symmetry of the k-space, or the like. Alternatively, an iterative reconstruction method of correcting missing data through an iterative operation may be adopted.

Figure 10:
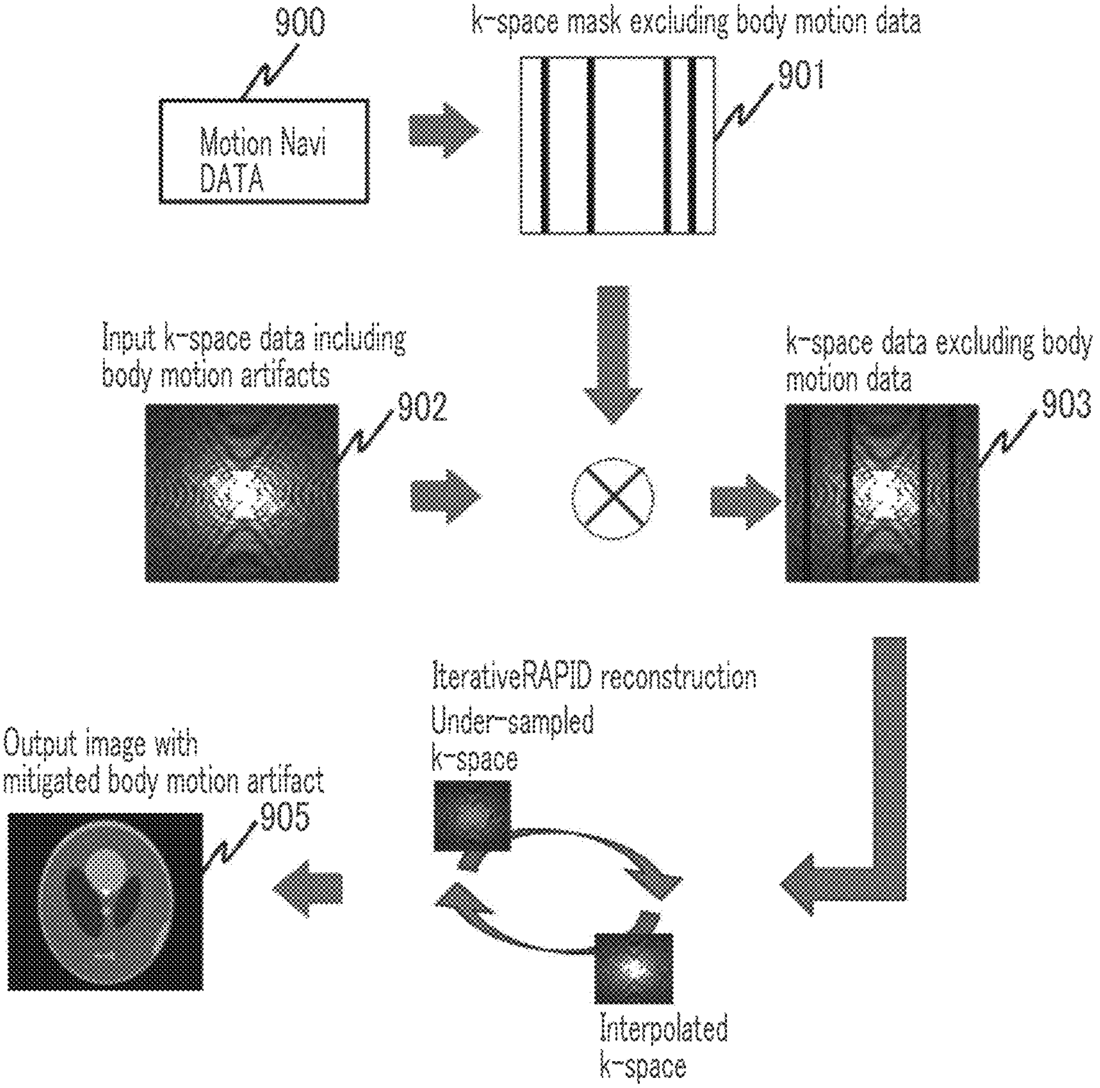
FIG. 10 is a diagram illustrating removal of body motion data and image reconstruction using the data after removal.

FIG. 10 is a conceptual diagram of one method of iterative reconstruction.

First, a mask 901 of the removal data is created using body motion information 900 obtained from the navigator echo, and image data 902 measured by the imaging unit is multiplied by the mask 901 to obtain measurement data 903 excluding the removal data. The iterative reconstruction operation is an operation of minimizing a difference between the measurement data after interpolation and the undersampled measurement data while repeating interpolation and norm minimization in a sparse space with respect to the undersampled measurement data (or an image thereof), and it is possible to obtain an image 905 in which the removal data is interpolated and the consistency of the image information of the original measurement data is maintained.

Re-Measurement: S8

In a case in which a range of the body motion-related data is large and the image quality cannot be ensured even by using each of the above-described methods, the body motion processing unit 240 sends the range of the body motion-related data to the imaging controller 210, and the imaging controller 210 controls the imaging unit 10 to re-execute the imaging in the range. In this case, a UI for inputting the necessity of the re-measurement together with the range of the body motion-related data may be displayed on the user interface unit 70 (display device 40), and the user may select the necessity of the re-measurement.

As described above, with the MRI apparatus of the present embodiment, the navigator data acquisition timing for detecting the body motion is automatically decided according to the TR in the set imaging sequence. Therefore, it is possible to acquire the body motion information with an appropriate time resolution regardless of the length of the TR and to perform appropriate body motion correction.

In addition, in the short TR imaging, the navigator echo is acquired for each TR, so that it is possible to avoid the extension of the TR and the increase in the imaging time.

Further, by adopting a simple operation method using the intensity of the signal as the body motion detection method using the navigator echo, it is possible to reduce an operation load and improve the real-time performance of the body motion detection.

Modification Example 1 of Embodiment 1

Figure 11:
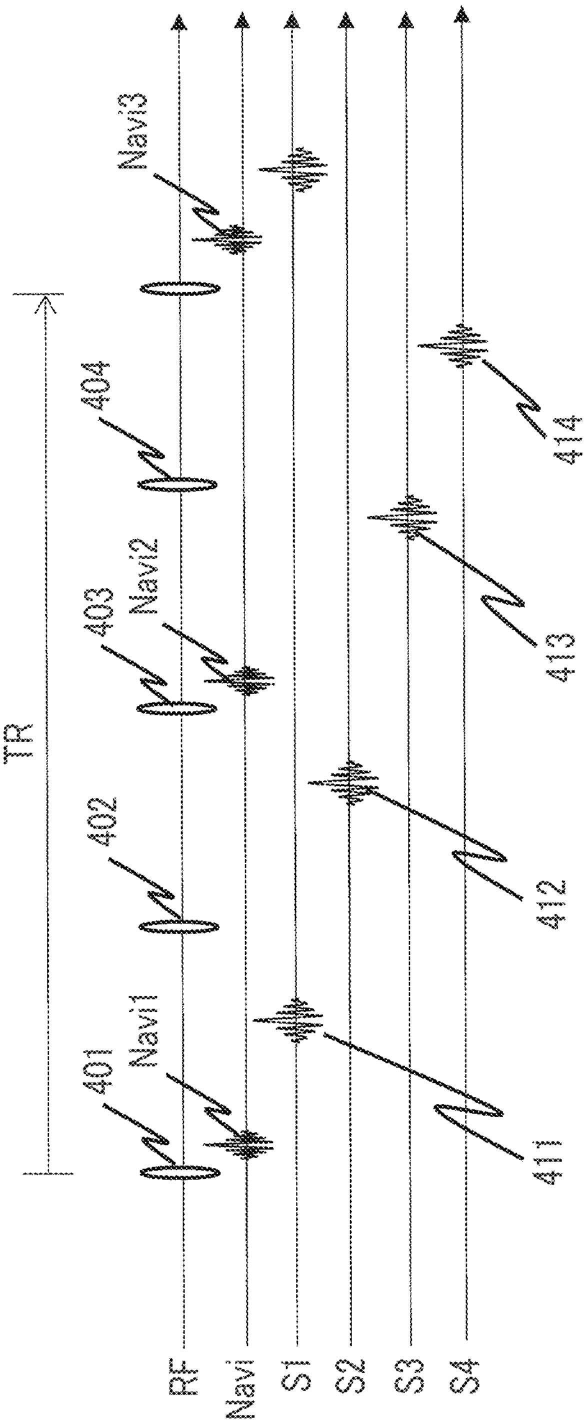
FIG. 11 is a diagram showing a pulse sequence example of a modification example of Embodiment 1.

In Embodiment 1, the configuration is adopted in which whether the navigator echo is acquired for one slice (FIG. 4A) or for one TR (FIGS. 6A and 6B) is alternatively selected depending on whether the TR is long or short using one TH, but, in a case in which the TR is relatively long, as shown in FIG. 11, the number of times the navigator echo is acquired in the TR can also be set to two or more. In this example, the navigator echo is acquired for every two slices. In this case, TH1 and TH2 of two or more are set for the TR, and for example, in a case in which the TR of the imaging pulse sequence is equal to or greater than TH1, the number of times the navigator echo is acquired is set to once for each slice within one TR, and in a case in which the TR of the imaging pulse sequence is less than TH2, the number of times the navigator echo is acquired is set to once for each TR. In a case in which the number of times the navigator echo is acquired is less than TH1 and equal to or greater than TH2, one time is set to once for every two slices or three slices within one TR.

In addition, instead of setting a plurality of threshold values TH, the acquisition frequency of the navigator echo may be roughly estimated, and the acquisition timing of the navigator echo may be controlled according to the acquisition frequency. In a case in which the approximate frequency of acquiring the navigator echo is calculated by dividing the TR by "the number of times of acquisition within one TR", in an intermediate TR between the long TR imaging shown in FIGS. 4A and 4B and FIGS. 5A and 5B and the short TR imaging shown in FIGS. 6A and 6B and FIGS. 7A and 7B, for example, as shown in FIG. 11, the same acquisition frequency can be maintained by acquiring the navigator echo for every two slices.

Since the approximate frequency of acquiring the navigator echo can be estimated from the number of slices (the number of slices per TR) set by the imaging parameters and the TR, the number of times the navigator echo is acquired can be set such that the approximate frequency of the navigator echo does not fall below a predetermined frequency (for example, the time resolution of the body motion detection desired by the user). As a result, it is possible to detect the occurrence of the body motion with a predetermined time resolution while suppressing the extension of the TR as much as possible according to the TR.

Embodiment 2

In Embodiment 1, a case in which the body motion information is acquired from the navigator data has been described, but, in the present embodiment, in addition to the navigator data, information from optical body motion detection means is incorporated, and the information is used together with the body motion information detected from the navigator data. As the optical body motion detection means, a contactless optical sensor, an infrared sensor, imaging means such as a stereo camera can be used, and, in the following, the present embodiment will be described using a case in which a video of a camera is used as an example.

In the present embodiment, similarly to Embodiment 1, the timing of acquiring the navigator data is controlled according to the TR, and the navigator data obtained with a predetermined time resolution is analyzed to obtain the body motion information. Hereinafter, a difference from Embodiment 1 will be described.

In the MRI apparatus of the present embodiment, one or a plurality of cameras are installed near or within the static magnetic field space in which the examination target 50 is disposed. It is preferable that the camera is, for example, a wide angle camera or a stereo camera that can surveil a relatively wide range of the examination target. The camera is connected to the controller 20 of the MRI apparatus in a wired or wireless manner, and a video for each frame of the camera is captured by the controller 20. The body motion processing unit 240 of the controller 20 captures video data from the camera and detects the occurrence of the body motion. Therefore, the body motion processing unit 240 comprises the camera data analysis unit 245 in addition to the navigator data analysis unit 241 and the removal data determination unit 243 of Embodiment 1, as shown in a broken line square in FIG. 8.

The camera data analysis unit 245 analyzes the camera video, estimates the magnitude of the displacement of the examination target, and determines the body motion by, for example, threshold value processing. Specifically, the displacement vector of the subject is calculated by an operation such as optical flow for the video data for each frame. In this case, a predetermined ROI may be set for the examination target, and the displacement vector may be calculated for the ROI. Then, the displacement vector integrated from start of imaging to a predetermined time point is defined as the displacement with respect to a position (reference position) at a start time point of imaging. Alternatively, a difference between an image of a frame (a frame at a start time point of imaging) serving as a reference for the displacement vector and an image of a frame at a predetermined time point may be defined as the displacement at the time point. The displacement calculated in this manner is a gentle curve having a period of a respiratory motion in a part where the respiratory motion or the like occurs, for example, as in FIG. 9, but, in a case in which a sudden motion (body motion) occurs, the displacement shows the displacement corresponding to the motion.

The camera data analysis unit 245 uses the range of the respiratory motion (upper limit and lower limit of displacement) as a threshold value for displacement, and in a case in which the displacement that is equal to or greater than or is equal to or less than the threshold value is detected, the camera data analysis unit 245 determines that body motion is occurring and specifies the time during which the body motion is occurring.

The removal data determination unit 243 of the body motion processing unit 24 performs an AND operation between the body motion occurrence time, which is the analysis result of the navigator data analysis unit 241 and the body motion occurrence time, which is specified by the camera data analysis unit 245, and specifies the image data collected at the body motion occurrence time as the removal data, using the obtained body motion occurrence time as the body motion occurrence time.

Figure 12:
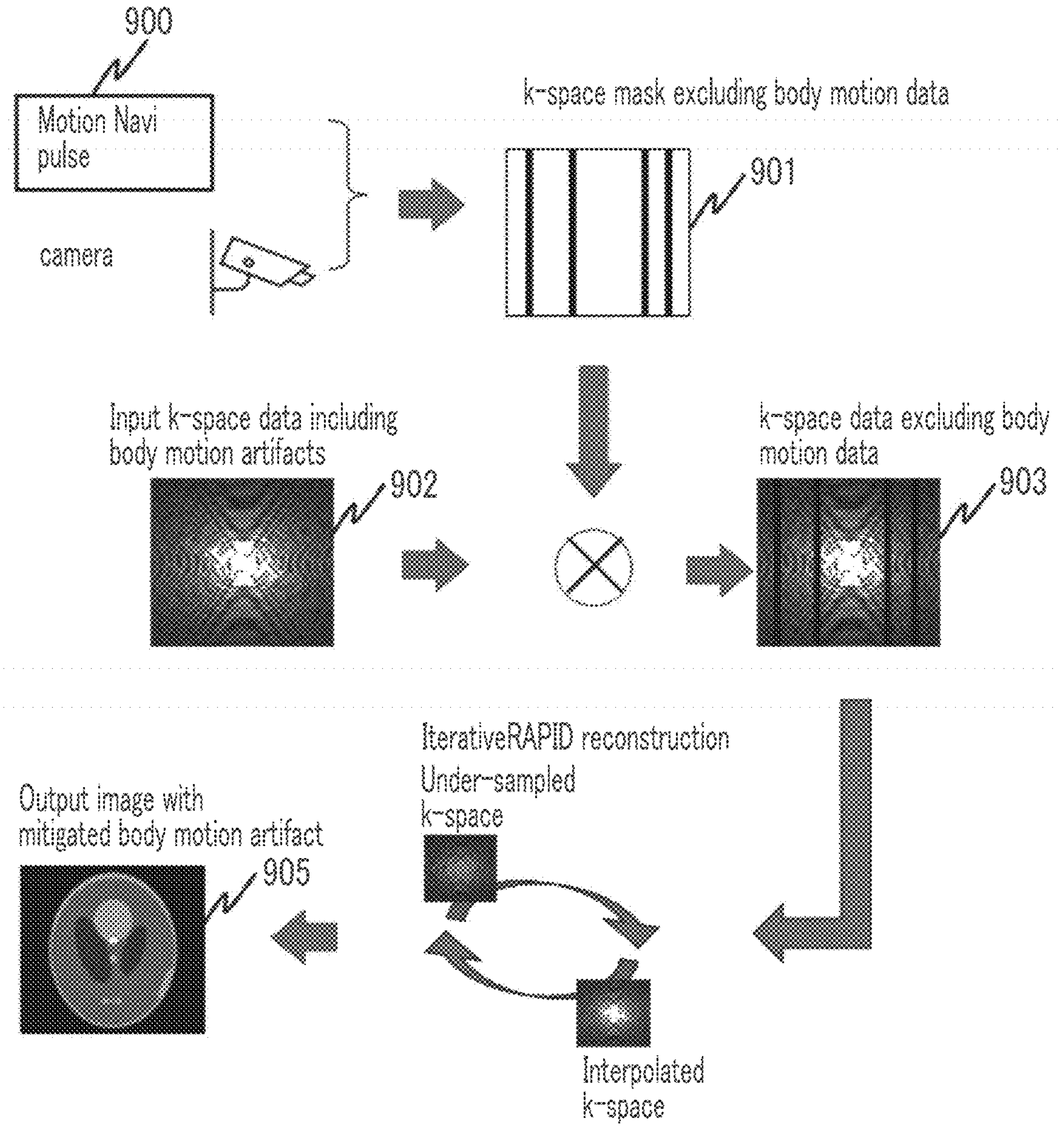
FIG. 12 is a diagram illustrating the removal of body motion data and image reconstruction using the data after removal according to Embodiment 2.

Thereafter, the image is reconstructed excluding the removal data or the removal data is re-measured, which is the same as in Embodiment 1. FIG. 12 shows a reconstruction example of the present embodiment corresponding to the processing shown in FIG. 10. In FIG. 12, the same elements as those in FIG. 10 are denoted by the same reference numerals, and the description thereof will be omitted.

According to the present embodiment, the same effects as those of Embodiment 1 can be obtained, and further, the camera video is used in combination with the body motion detection, so that it is possible to capture a fine motion before and after the body motion detected by the navigator echo, and it is possible to perform image reconstruction in which the influence of the body motion is more precisely eliminated. In addition, depending on the body motion, the situation or position of the examination target may change to an extent that it affects subsequent measurement, and such a change in the examination target can also be detected, so that subsequent processing using the body motion information can be performed more appropriately.

Although the embodiments of the present invention have been described above, the sequence or pulse sequence for acquiring the navigator data and the image processing method for the measurement data having the missing data, which have been described as the embodiments, are merely examples, and various changes can be made within the scope of the present invention, and such changes are also included in the present invention.

EXPLANATION OF REFERENCES

- 1: MRI apparatus
- 10: imaging unit
- 20: controller
- 210: imaging controller
- 220: image generation unit
- 240: body motion processing unit

What is claimed is:

1. A magnetic resonance imaging apparatus comprising:

an RF transmitting unit that applies a high-frequency magnetic field pulse to an examination target placed in a static magnetic field space;

an RF receiving unit that receives a nuclear magnetic resonance signal emitted by the examination target;

a gradient magnetic field generation unit that generates a gradient magnetic field pulse for applying a magnetic field gradient to a static magnetic field;

an image generation unit that generates an image of the examination target by using the nuclear magnetic resonance signal; and one or more processors that control the RF transmitting unit, the RF receiving unit, and the gradient magnetic field generation unit in accordance with a predetermined pulse sequence, wherein the predetermined pulse sequence includes a pulse sequence for generating a navigator echo separately from an echo signal for image generation of the examination target, and the one or more processors make a timing of generating the navigator echo different between a case in which a repetition time of the pulse sequence is equal to or greater than a preset threshold value and a case in which the repetition time is less than the threshold value.

2. The magnetic resonance imaging apparatus according to claim 1, wherein the pulse sequence is a multi-slice imaging sequence for measuring echo signals of one or a plurality of slices other than one slice within a repetition time of the one slice, and the one or more processors generate the navigator echo for each slice measured within the repetition time of the one slice in a case in which the repetition time of the pulse sequence is equal to or greater than the threshold value.

3. The magnetic resonance imaging apparatus according to claim 1, wherein the pulse sequence is a multi-slice imaging sequence for measuring echo signals of one or a plurality of slices other than one slice within a repetition time TR of the one slice, and the one or more processors generate, within the repetition time of the one slice, the navigator echoes whose number is smaller than the number of the slices measured within the repetition time of the one slice in a case in which the repetition time of the pulse sequence is less than the threshold value.

4. The magnetic resonance imaging apparatus according to claim 3, wherein the one or more processors generate one navigator echo in each repetition time of the one slice.

5. The magnetic resonance imaging apparatus according to claim 1, wherein the one or more processors control the timing of generating the navigator echo such that a generation frequency of the navigator echo is equal to or higher than a certain generation frequency.

6. The magnetic resonance imaging apparatus according to claim 1, wherein the one or more processors measure the navigator echo as an FID signal generated after an RF pulse is applied to generate the echo signal for image generation.

7. The magnetic resonance imaging apparatus according to claim 1, wherein the one or more processors generate the navigator echo by applying an RF pulse different from an RF pulse applied to generate the echo signal for image generation.

8. The magnetic resonance imaging apparatus according to claim 1, wherein the one or more processors detect a body motion of the examination target by using navigator data consisting of a plurality of the navigator echoes, and detect the body motion occurring in the examination target from a change in intensity of the navigator echo.

9. The magnetic resonance imaging apparatus according to claim 1, wherein the one or more processors detect a body motion of the examination target by using navigator data consisting of a plurality of the navigator echoes, receive a detection result from an optical detection device that is attached to the magnetic resonance imaging apparatus and that monitors a motion of the examination target, and decide data to be removed from the echo signal for image generation by using the detection result and a detection result of the body motion of the examination target using the navigator data.

10. A method of controlling a magnetic resonance imaging apparatus that performs imaging in accordance with a pulse sequence, the method comprising:

performing control of generating a navigator echo at a predetermined timing in the pulse sequence, and performing control of making a timing at which the navigator echo is acquired different between a case in which a repetition time of the pulse sequence is equal to or greater than a preset threshold value and a case in which the repetition time is less than the threshold value.

11. The method of controlling a magnetic resonance imaging apparatus according to claim 10, wherein the pulse sequence is a multi-slice imaging sequence for measuring echo signals of one or a plurality of slices other than one slice within a repetition time TR of the one slice, and in a case in which the repetition time of the pulse sequence is less than the threshold value, the navigator echo is acquired for each repetition time, and, in a case in which the repetition time of the pulse sequence is equal to or greater than the threshold value, the navigator echo is acquired for each slice.

12. The method of controlling a magnetic resonance imaging apparatus according to claim 10, wherein a timing of generating the navigator echo is controlled such that a frequency of generating the navigator echo is equal to or higher than a certain frequency.

* * * * *